United States Patent
Ogura

(10) Patent No.: US 9,728,984 B2
(45) Date of Patent: Aug. 8, 2017

(54) USING RIBS IN CHARGER TO DISSIPATE HEAT GENERATED BY CHARGING CIRCUIT

(71) Applicant: Makita Corporation, Anjo-shi, Aichi (JP)

(72) Inventor: Hironori Ogura, Anjo (JP)

(73) Assignee: MAKITA CORPORATION, Anjo-shi (JP)

( * ) Notice: Subject to any disclaimer, the term of this patent is extended or adjusted under 35 U.S.C. 154(b) by 270 days.

(21) Appl. No.: 14/298,244

(22) Filed: Jun. 6, 2014

(65) Prior Publication Data

US 2014/0375269 A1    Dec. 25, 2014

(30) Foreign Application Priority Data

Jun. 25, 2013  (JP) ................. 2013-132291

(51) Int. Cl.
   *H02J 7/00*    (2006.01)
   *H05K 7/20*    (2006.01)

(52) U.S. Cl.
   CPC ........ *H02J 7/0026* (2013.01); *H05K 7/20409* (2013.01); *H05K 7/20436* (2013.01)

(58) Field of Classification Search
   CPC .............. H02J 7/0026; H05K 7/20409; H05K 7/20436
   See application file for complete search history.

(56) References Cited

U.S. PATENT DOCUMENTS

| | | | | |
|---|---|---|---|---|
| 4,282,475 A | * | 8/1981 | Milton ................. | H02J 7/0024 320/126 |
| 4,532,194 A | * | 7/1985 | Liautaud ............. | H01M 2/1055 429/121 |
| 4,536,694 A | * | 8/1985 | McCarty .............. | H02J 7/0042 174/54 |
| 4,558,270 A | * | 12/1985 | Liautaud ............... | H02J 7/0045 320/110 |

(Continued)

FOREIGN PATENT DOCUMENTS

| | | |
|---|---|---|
| DE | 40 26 020 CI | 12/1991 |
| DE | 20 2004 019 007 U1 | 3/2005 |

(Continued)

OTHER PUBLICATIONS

Extended European Search Report issued in European Patent Application No. 14172232.2 on Oct. 21, 2014.

(Continued)

*Primary Examiner* — Naum B Levin
(74) *Attorney, Agent, or Firm* — Oliff PLC

(57) ABSTRACT

An insulation rib is provided above a charging circuit and a plurality of heat radiation ribs are provided on the left side of the charging circuit. A space part is formed by the insulation rib. Little of the heat generated by the charging circuit is transferred to an upper sidewall portion of a case main body portion due to a heat insulation effect of the space part. Further, heat generated by the charging circuit is likely to be transferred to a left sidewall portion of the case main body portion due to a high heat dissipation effect of the heat radiation ribs. In this way, the generation of locally heated areas in the case main body portion can be reduced through balancing of the flow of heat generated by the charging circuit.

9 Claims, 5 Drawing Sheets

(56) References Cited

U.S. PATENT DOCUMENTS

| | | | | |
|---|---|---|---|---|
| 4,588,938 A * | 5/1986 | Liautaud | H02J 7/0045 | 320/115 |
| 4,609,860 A * | 9/1986 | Fasen | H02J 7/008 | 320/113 |
| 4,641,077 A * | 2/1987 | Pascaloff | A61L 2/00 | 320/113 |
| 5,448,151 A * | 9/1995 | Ganse | H02J 7/0042 | 320/107 |
| 5,583,418 A * | 12/1996 | Honda | B60L 11/1825 | 320/106 |
| 5,926,005 A * | 7/1999 | Holcomb | H02J 7/0042 | 320/107 |
| 6,066,938 A * | 5/2000 | Hyodo | H02J 7/0042 | 320/114 |
| 6,956,354 B2 * | 10/2005 | Lie | H02J 7/0042 | 320/107 |
| 6,977,484 B1 * | 12/2005 | Peng | H02J 7/0042 | 320/137 |
| 7,492,125 B2 * | 2/2009 | Serdynski | H01M 2/34 | 320/106 |
| 7,576,513 B1 * | 8/2009 | Nierescher | H01M 10/44 | 320/107 |
| 7,642,002 B2 * | 1/2010 | Hamery | B60L 11/1874 | 180/68.1 |
| 7,799,448 B2 * | 9/2010 | Cruise | H01M 2/1022 | 361/118 |
| 7,813,128 B2 * | 10/2010 | Marchand | H05K 7/20909 | 361/694 |
| 8,450,970 B1 * | 5/2013 | Drinkwater | H02J 7/0044 | 320/107 |
| 9,035,597 B2 * | 5/2015 | Sharaf | H05K 7/209 | 320/107 |
| 2002/0028375 A1 * | 3/2002 | Morishita | H01M 2/1077 | 429/120 |
| 2002/0054480 A1 * | 5/2002 | Jitaru | H01F 27/06 | 361/704 |
| 2005/0007068 A1 * | 1/2005 | Johnson | B25F 5/02 | 320/110 |
| 2005/0017681 A1 * | 1/2005 | Ogishima | A47L 9/2805 | 320/112 |
| 2005/0134727 A1 * | 6/2005 | Teramoto | H04N 5/2251 | 348/375 |
| 2005/0200339 A1 * | 9/2005 | Phillips | H02J 7/022 | 323/243 |
| 2007/0190409 A1 * | 8/2007 | Sakurai | H01G 2/04 | 429/159 |
| 2008/0113262 A1 * | 5/2008 | Phillips | H01M 2/105 | 429/149 |
| 2009/0057285 A1 * | 3/2009 | Bashore | B23K 9/32 | 219/130.1 |
| 2009/0237029 A1 * | 9/2009 | Andelfinger | H02J 7/025 | 320/108 |
| 2011/0074362 A1 * | 3/2011 | Midorikawa | H01M 10/443 | 320/150 |
| 2012/0098494 A1 | 4/2012 | Ogura et al. | | |
| 2013/0229153 A1 * | 9/2013 | Sarkar | H01M 10/46 | 320/130 |
| 2013/0313925 A1 * | 11/2013 | Mergener | B25F 5/00 | 310/50 |
| 2014/0375269 A1 * | 12/2014 | Ogura | H02J 7/0026 | 320/112 |
| 2015/0155724 A1 * | 6/2015 | Han | H02J 7/0042 | 320/101 |

FOREIGN PATENT DOCUMENTS

| | | |
|---|---|---|
| DE | 10 2004 020 147 A1 | 11/2005 |
| EP | 0 793 326 A1 | 9/1997 |
| EP | 1 139 709 A2 | 10/2001 |
| EP | 1 475 876 A1 | 11/2004 |
| GB | 2 399 701 A | 9/2004 |
| JP | H05-315013 A | 11/1993 |
| JP | H11-129379 A | 5/1999 |
| JP | 2002-078212 A | 3/2002 |
| JP | A-2012-95417 | 5/2012 |
| JP | 2012-129379 A | 7/2012 |
| WO | WO 2007/041738 A2 | 4/2007 |

OTHER PUBLICATIONS

Aug. 16, 2016 Office Action issued in Japanese Patent Application No. 2013-132291.

* cited by examiner

USING RIBS IN CHARGER TO DISSIPATE HEAT GENERATED BY CHARGING CIRCUIT

This application claims priority to Japanese patent application serial number 2013-132291, the contents of which are incorporated herein by reference.

BACKGROUND OF THE INVENTION

Field of the Invention

The present invention relates to a charger for charging a battery pack of a rechargeable electric power tool.

Description of the Related Art

A battery pack serving as a power source for a rechargeable electric power tool such as a screw-tightening tool or a cutting tool can be removed from the electric power tool and charged using a dedicated charger. In most cases, an alternating current of 100 volts is used for charging. A lithium ion battery having DC 18 volts, for example, can be charged by the charger.

Further, there is a type of charger that can be attached to a belt round a user's waist. This type of charger is electrically connected to a tool main body via an electric cord. A separate battery pack from a battery pack mounted to the tool main body is attached to this type of charger. The separate battery pack can charge the battery pack mounted to the tool main body via the electric cord.

Various improvements have been made for these types of charger. For example, Japanese Laid-Open Patent Publication No. 2012-95417 discloses a charger in which its water-resistant property can be improved by sealing the inside of the charger.

A charging circuit, for controlling the operation of charging, is housed inside the charger. The charging circuit may include a transformer and switching elements with a heat sink, and these elements may become heat generation sources. Accordingly, when the case of the charger is configured to seal in order to improve its water-resistant property, heat generated by the charging circuit is likely to accumulate inside the case. Normally, the heat generated by the charging circuit is transferred upwards by convection, and thus the upper side of the case is likely to be locally heated. If a user happens to touch these areas which are locally heated, the user may find it quite uncomfortable or even impossible to hold and carry the charger. Further, the user may mistakenly believe that something is wrong with the charger.

Thus, there is a need to prevent surfaces of the case of the charger from being locally heated.

SUMMARY OF THE INVENTION

According to a first aspect of the invention, a charger for charging a battery pack comprises a charging circuit inside a main body. A plurality of heat radiation ribs lying parallel to each other are provided on a lateral side of the charging circuit for dissipating heat generated by the charging circuit.

In the first aspect, heat generated by the charging circuit may be easily transferred to a sidewall of the main body case through the heat radiation ribs. Without the heat radiation ribs, a rise in temperature in the upper sidewall is higher than that in the lateral sidewall. This occurs because heat generated by the charging circuit generally flows upwards. The heat radiation ribs may balance the rise in temperature between the upper and the lateral sidewalls. In this way, the rise in temperature in the upper sidewall may be greatly reduced.

According to another aspect of the invention, the heat radiation ribs extend from an inner surface of a sidewall of the case main body towards an inner side of the case main body.

In the above aspect, heat generated by the charging circuit can be efficiently dissipated to the outside of the main body case.

According to another aspect of the invention, in the situation where an imbalance in a rise in temperature occurs via the heat generated by the charging circuit, the heat radiation ribs may be disposed in an area where a rise in temperature is low.

In the above aspect, heat generated by the charging circuit is transferred to the heat radiation ribs, and thus an imbalance in a rise in temperature between the upper and lateral sidewall of the main body case may be reduced. Accordingly, heat generated by the charging circuit can be dissipated from the entirety of the main body case.

According to another aspect of the invention, the heat radiation ribs are integrally molded with the main body case using the same material as the main body case.

In the above aspect, the manufacturing costs of the main body case and the charger can be reduced.

According to another aspect of the invention, the main body case includes a case main body portion and a case bottom portion. The case main body portion may include a battery-mounting portion for mounting a battery pack on a front side thereof and an opening on a rear side thereof. Further, the main body case is configured such that the opening of the case main body portion is covered and joined by the case bottom portion. Further, the heat radiation ribs extend from the front side of the case main body portion toward the opening of the rear side of the case main body portion.

In the above aspect, heat radiation ribs having a large area may improve heat radiation effect. Further, when the heat radiation ribs are integrally molded with the case main body portion, a punching operation becomes easy. Thus, the molding process can be simplified.

According to another aspect of the invention, the main body case is configured to be tightly sealed.

In the above aspect, water-resistant property and dust-resistant property can be improved. Generally, a sealed structure of the main body case allows heat generated by the charging circuit to accumulate in the main body case. Thus, heat radiation effect may decrease. However, heat generated by the charging circuit can be efficiently dissipated by the heat radiation ribs, and accordingly an imbalance in a rise in temperature can be reduced. That is, locally heated areas in the main body case will not be easily generated. In this respect, providing the heat radiation ribs in the main body case having the sealed structure has a great significance.

According to another aspect of the invention, the heat radiation ribs are made from metal.

In the above aspect, heat dissipation of the ribs can be improved.

According to another aspect of the invention, in the situation where an imbalance in a rise in temperature occurs by the heat generated by the charging circuit, the insulation rib(s) may be disposed between a sidewall and the charging circuit where a rise in temperature is high.

In the above aspect, locally heated areas in the surface of the main body case will not be easily generated due to the insulation rib. Through a synergistic effect of the heat insulating effect of the insulating rib and the heat dissipation effect of the heat radiation ribs, an imbalance in a rise in temperature can be reduced and heat dissipation in the entirety of the main body case can be improved.

According to another aspect of the invention, an electric device comprises a charging circuit inside a main body case thereof. A plurality of heat radiation ribs are provided in parallel on a lateral side of the charging circuit. They are used for absorbing heat generated by the charging circuit and dissipating the heat to the outside of the main body case.

In the above aspect, locally heated areas generated by the charging circuit may not be easily generated, and an imbalance in a rise in temperature in the whole main body case can be reduced. Further, heat dissipation of the whole main body case can be efficiently made owing to heat dissipation effect of the heat radiation ribs.

DETAILED DESCRIPTION OF THE INVENTION

Each of the additional features and teachings disclosed above and below may be utilized separately or in conjunction with other features and teachings to provide an improved charger. Representative examples of the present teaching, which examples utilize many of these additional features and teachings both separately and in conjunction with one another, will now be described in detail with reference to the attached drawings. This detailed description is merely intended to teach a person of skill in the art further details for practicing preferred aspects of the present teachings and is not intended to limit the scope of the invention. Only the claims define the scope of the claimed invention. Therefore, combinations of features and steps disclosed in the following detailed description may not be necessary to practice the invention in the broadest sense, and are instead taught merely to particularly describe representative examples of the invention. Moreover, various features of the representative examples and the dependent claims may be combined in ways that are not specifically enumerated in order to provide additional useful examples of the present teachings.

Figure 1:
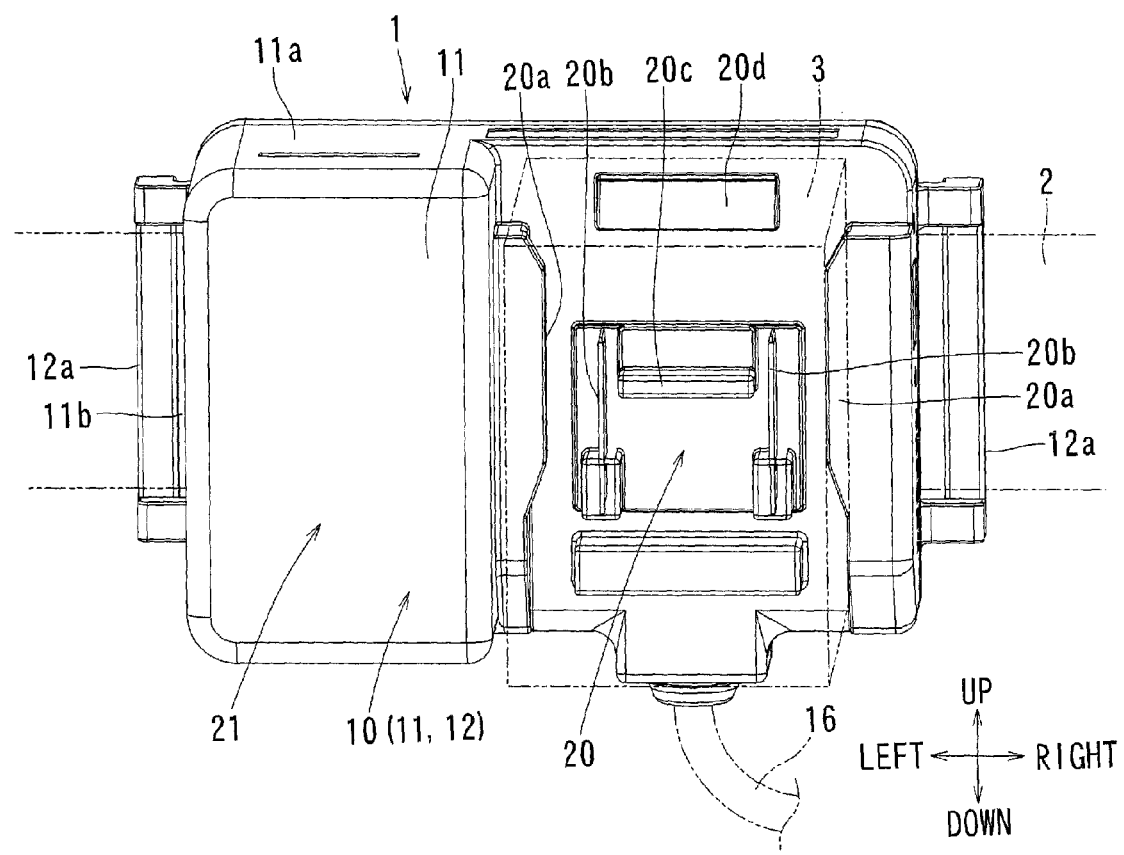
FIG. 1 is a perspective view of a charger according to an embodiment when seen from a front side.
Figure 2:
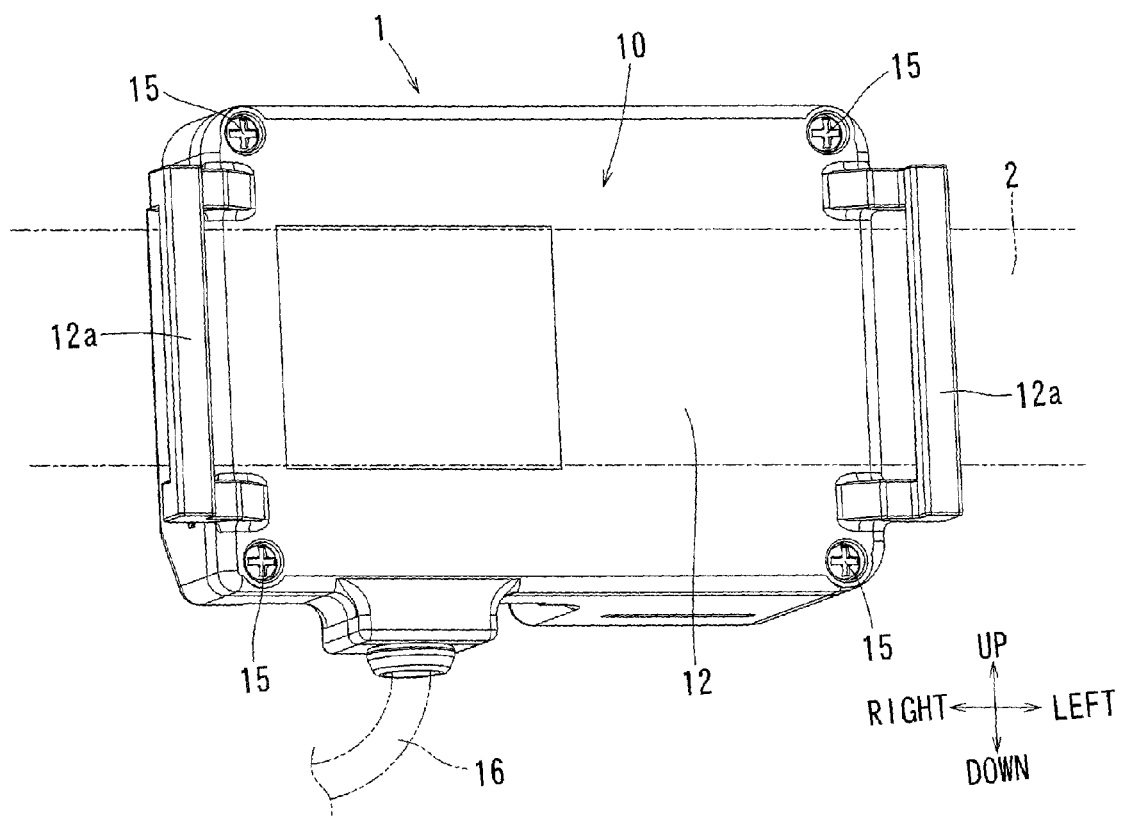
FIG. 2 is a perspective view of a charger according to an embodiment when seen from a rear side.

One embodiment of the present invention will be described below with reference to FIGS. 1 to 5. FIGS. 1 and 2 show a charger 1 of the present invention. The embodiment shows a type of charger to be carried by a worker. The charger 1 can be hung from a belt around the worker's waist.

The charger 1 is provided with a battery-mounting part 20 for mounting a battery pack 3 on a front side of a main body case 10. The charger 1 can charge a separate battery pack attached to an electric power tool in use (not shown). The separate battery pack can be charged from the battery pack 3 mounted on the battery-mounting part 20.

Figure 4:
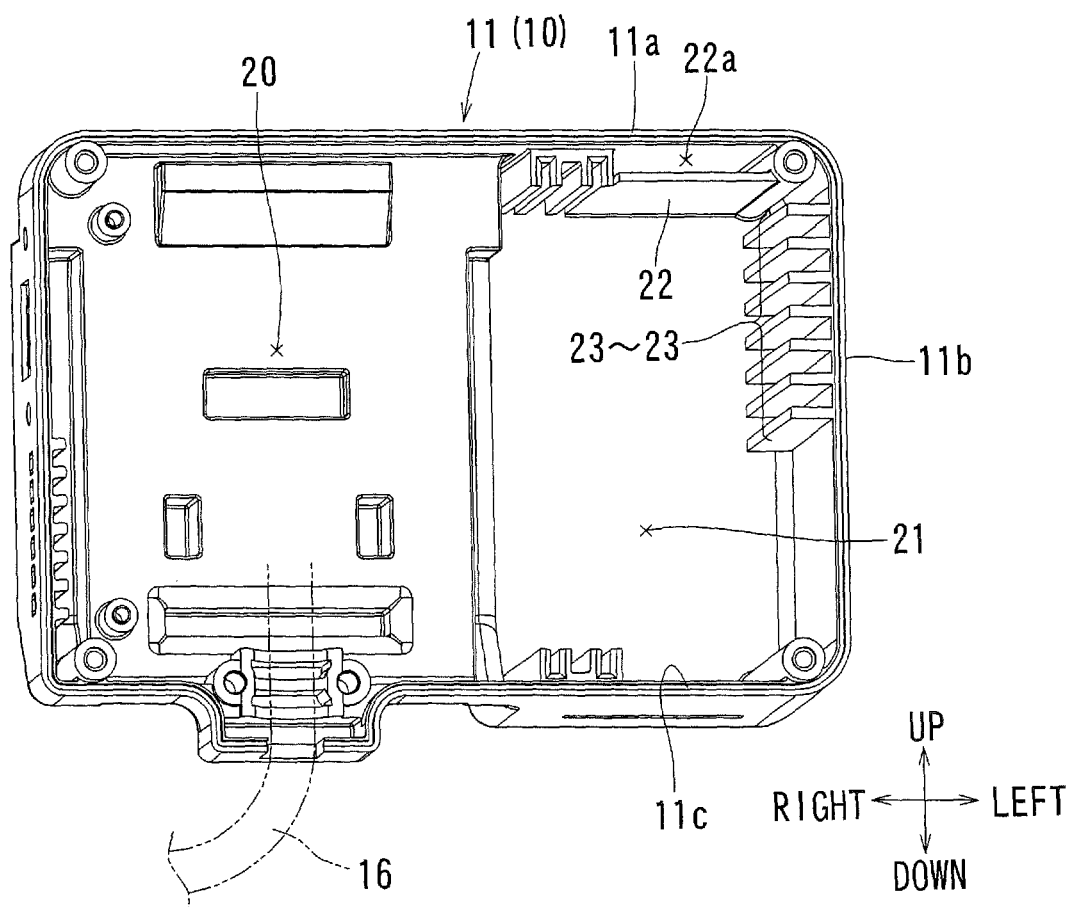
FIG. 4 is a perspective view of a case main body. This figure shows the inside of the case main body when seen from the rear side, with a bottom plate portion of the case removed.
Figure 5:
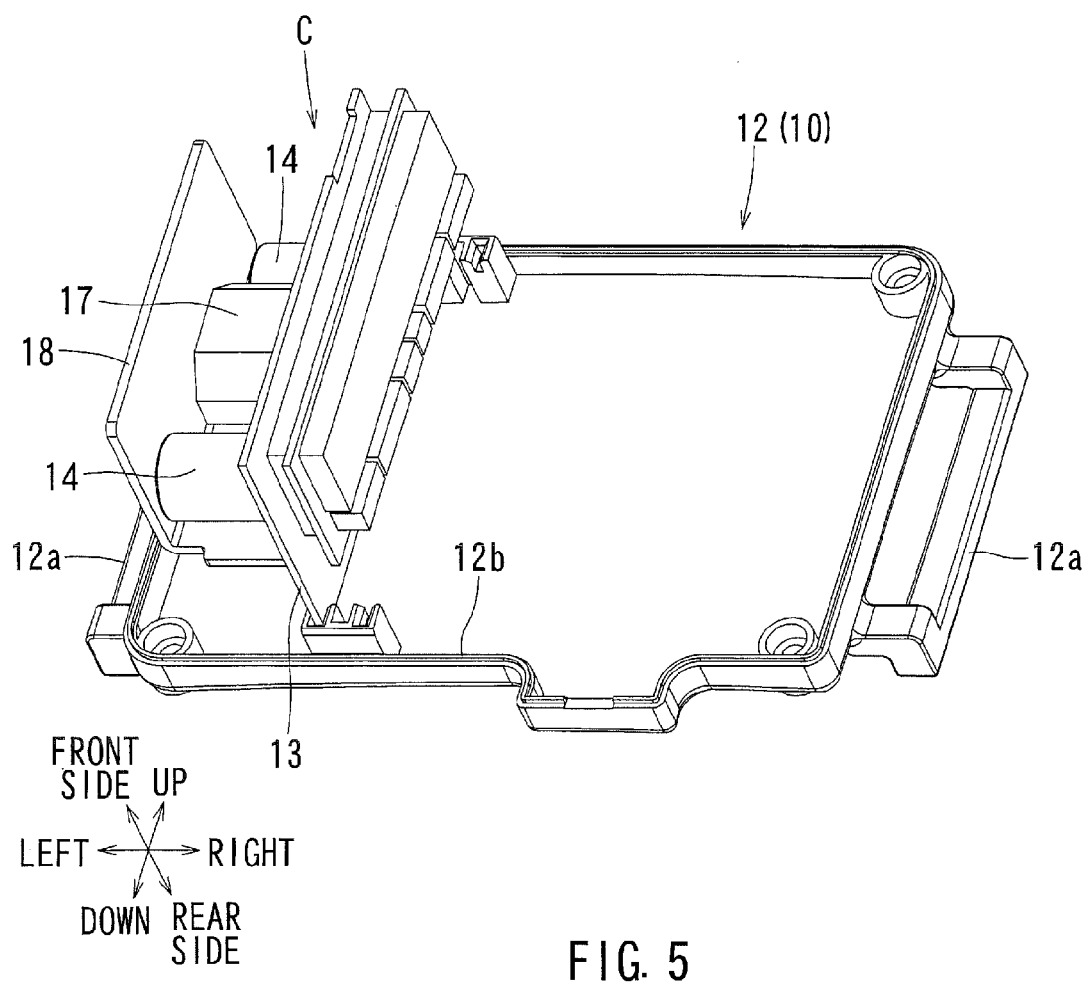
FIG. 5 is a perspective view of a bottom plate portion of the case when seen from a front side.

The main body case 10 includes a case main body portion 11 and a tabular case bottom portion 12. The main body case 10 is configured such that an opening on a rear side of the case main body portion 11 is covered and joined by the case bottom portion 12. FIG. 4 shows the case main body portion 11, and FIG. 5 shows the case bottom portion 12. Both the case main body portion 11 and the case bottom portion 12 are manufactured by molding synthetic resin. As shown in FIG. 2, the main body case 10 is configured such that the opening of the rear side of the case main body portion 11 is covered by the case bottom portion 12, and the case bottom portion 12 is screwed to the case main body portion 11. Further, as shown in FIG. 4, an elongated recessed groove 1c is provided in the opening end of the case main body portion 11. Further, as shown in FIG. 5, an elongated protrusion 12b is provided corresponding to the elongated recessed groove 1c in the end of the case bottom portion 12. The case main body portion 11 is connected to the case bottom portion 12 with each other by fitting the protrusion 12b to the recessed groove 1c. Due to this structure, the main body case 10 has a sealed structure which can improve its water-resistant property and dust-resistant property.

Belt inserting parts 12a for inserting a waist belt 2 are provided on the left and right side of the case bottom portion 12.

As shown in FIG. 5, a charging circuit C composed of a capacitor 14, a transformer 17, a heat sink, and a circuit board 12, may be disposed on a front side (inner surface side) of the case bottom portion 12. The transformer 17 and switching elements to which the heat sink 18 is attached may serve as a heat source.

Figure 3:
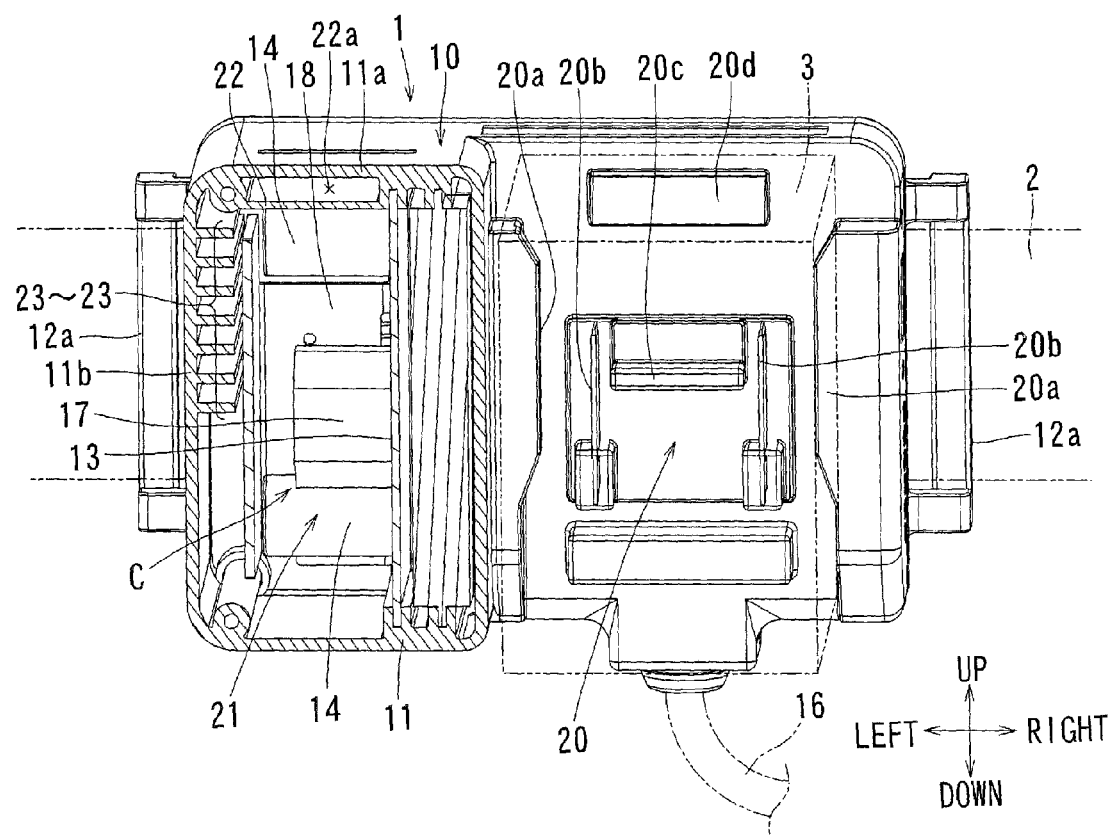
FIG. 3 is a perspective view of a charger according to an embodiment when seen from a front side, partially showing the inside of the charger in a dashed line.

As shown in FIGS. 1, 3, and 4, the case main body portion 11 includes a battery-mounting part 20 and an electric circuit housing part 21. The battery-mounting part 20 is disposed on the right side and the electric circuit housing part 21 is disposed on the left side when seen from a front side. A pair of rail portions 20a is provided on the battery-mounting part 20. Using the pair of rail portions 20a, the battery pack 3 can be slid into the battery-mounting part 20 in a downward direction. In this way, the battery pack 3 can be attached to the battery-mounting part 20. A positive terminal 20b and a negative terminal 20b are provided between the pair of the rail portions 20a. Further, a connector 20c for transmitting and receiving control signals are disposed between the positive and negative terminals 20b. Using the sliding attachment of battery pack 3 along the pair of the rail portions 20a, the positive and negative terminals 20b and the connector 20c can be electrically connected to the corresponding portions of the battery pack 3.

An engagement recess portion 20d for engaging a lock claw of the battery pack 3 and maintaining the locking state is provided on an upper side of the battery-mounting part 20.

A power cord 16 is pulled out from a lower part of the battery-mounting part 20 of the main body case 10. The power cord 16 is connected to the electric power tool to be held by the worker. Electric power for charging the battery pack attached to the electric power tool is supplied from the charger 1 via the power cord 16. The worker can continue to use the electric power tool while the battery pack is charged using the charger 1. Accordingly, the worker can easily and quickly perform work using the electric power tool. In this way, efficiency can be improved.

As shown in FIG. 3, the charging circuit C is housed inside the electronic circuit housing part 21. An insulation rib 22 and a plurality of heat radiation ribs 23 are provided inside the electronic circuit housing part 21. The insulation rib 22 is integrally molded with the case main body portion 11. FIG. 3 shows that the insulation rib 22 on an upper side of the circuit housing part 21 is located above the charging circuit C. The insulation rib 22 is provided with a space part 22a from an upper sidewall portion 11a of the case main body portion 11. Heat generated by the charging circuit C is transferred to the insulation rib 22 located on an upper side of the case main body portion 11. However, since the space part 22a has low thermal conductivity, little of the heat generated by the charging circuit C is transferred to the upper sidewall portion 11a of the case main body portion 11.

The heat radiation ribs 23 are integrally molded with the case main body portion 11 as well as the insulation rib 22. FIG. 3 shows that the heat radiation ribs 23 are located on a left side of the charging circuit C and along an inner surface of a left sidewall portion 11b of the case main body portion 11. The heat radiation ribs 23 extend parallel with each other from the inner surface of the left sidewall portion 11b of the case main body portion 11 toward an inner side of the case main body portion 11 (right direction). Further, each heat radiation rib 23 extends over an entire range of a width direction from a front side of the left sidewall portion 11b toward the opening of the rear side of the left sidewall portion 11b (a butting part of the case bottom portion 12). The present embodiment shows that seven heat radiation ribs 23 are provided over the upper half of the left sidewall portion 11b. Heat generated by the charging circuit C is transferred to the heat radiation ribs 23. In this way, heat generated by the charging circuit C is easily transferred to the left sidewall portion 11b of the case main body portion 11.

The transformer 17 and the switching elements of the heat sink together comprise the charging circuit C and are major heat sources. Heat generated from them tends to flow upwards. Accordingly, when no method for heat dissipation is provided, the upper sidewall portion of the main body case 10 can get hotter than other portions, and locally heated areas may be generated in the upper sidewall portion of the main body case 10. The localization of heat with regards to the main body case, and in particular, the upper sidewall of the main body case, may be solved by effectively dissipating the generated heat. As described above, heat generated by the charging circuit C is not easily transferred toward the upper sidewall portion 11a of the case main body portion 11 due to the heat insulating layer of air in the space part 22a formed by the insulation rib 22. Further, heat generated by the charging circuit C can be easily transferred to the left sidewall portion 11b due to the heat radiation ribs 23. In this way, locally heated area may be reduced by balancing the flow of heat transfer.

In the above-described charger 1, heat transfer to the upper sidewall portion 11a of the main body case 10 can be restricted by the insulation rib 22. Further, heat transfer to the left sidewall portion 11b of the main body case 10 can be promoted by the heat radiation ribs 23. Accordingly, the flow of heat transfer may be balanced in the main body case 10. As a result, heat dissipation performance of the main body case 10 can be improved.

Further, the main body case 10, and in particular the upper surface (upper sidewall portion 11a) of the main body case 10, may resist localized heating caused by the charging circuit C. Accordingly, even if the worker uses the charger 1 while it is hung from the worker's waist belt 2, the worker may not feel heat from the main body case 10 caused by the charging circuit C.

In the above-described embodiment, the water-resistant property and dust-resistant property of the main body case 10 can be obtained by firmly connecting the case main body portion 11 and the case bottom portion 12. In this embodiment, heat transfer can be balanced by the insulation rib 22 and the heat radiation ribs 23 that are arranged in the main body case 10 having a sealed structure.

Various modifications can be made with respect to the above-described embodiments. For example, it is possible to balance heat transfer by using only the heat radiation ribs 23 that are provided on the left side of the charging circuit C, i.e. not using the insulating rib 22.

Further, some of the above-described embodiments show a plurality of heat radiation ribs 23 integrally molded with the case main body portion 11. However, separately formed heat radiation ribs using the same material as the case main body portion 11 can be attached to the inner surface of the left sidewall portion 11b of the case main body portion 11. Further, metal heat radiation ribs can be attached to the inner surface of the left sidewall of the case main body portion 11.

Further, some of the above-described embodiments show that the battery pack 3 attached to the battery-mounting part 20 in the charger 1 serves as a power supply for charging a battery pack attached to the electric power tool. However, the present invention can be applied to another type of charger in which a battery pack removed from the electric power tool may be attached to the battery-mounting part 20 and charged using a commercial power source of 100 volts.

I claim:

1. A charger for charging a battery pack, comprising a charging circuit inside a main body case thereof, wherein,
   a plurality of heat radiation ribs lying parallel to each other are provided inside the main body case and on a lateral side of the charging circuit for dissipating heat generated by the charging circuit;
   an insulation rib is disposed between the charging circuit and a sidewall where a rise in temperature caused by heat generated by the charging circuit is high,
   the insulation rib is provided with a space part from an upper sidewall portion having low thermal conductivity in order to restrict heat transfer to the upper side wall portion, and
   the main body case includes a case main body portion and a case bottom portion, the insulation rib directly contacting the case main body portion at two locations and extending toward the case bottom portion, and the space part being enclosed by the insulation rib and the upper sidewall portion.

2. The charger according to claim 1, wherein the plurality of heat radiation ribs extend from an inner surface of a sidewall of the main body case towards an inner side of the main body case.

3. The charger according to claim 1, wherein the plurality of heat radiation ribs are disposed in an area where a rise in temperature caused by heat generated by the charging circuit is low.

4. The charger according to claim 1, wherein the main body case is comprised of a material and the plurality of heat radiation ribs are integrally molded with the main body case using the material of the main body case.

5. The charger according to claim 1, wherein:
   the case main body portion including a battery-mounting portion for mounting the battery pack on a front side thereof and an opening on a rear side thereof;
   the main body case is configured such that the opening of the case main body portion is covered and joined by the case bottom portion; and the plurality of heat radiation ribs extend from the front side of the case main body portion toward the opening of the rear side of the case main body portion.

6. The charger according to claim 1, wherein the main body case is configured to be tightly sealed.

7. The charger according to claim 1, wherein the plurality of heat radiation ribs are made from metal.

8. The charger according to claim 1, wherein the insulation rib has a first end and a second end, the first end directly contacting a sidewall portion of the main body case at a first location and the second end directly contacting a case bottom portion of the main body case at a second location that is different from the first location so as to enclose the space part between the insulation rib and the upper sidewall portion.

9. An electric device comprising:
a charging circuit inside a main body case thereof, wherein:
   a plurality of heat radiation ribs lying parallel to each other are provided inside the main body case and on a lateral side of the charging circuit for absorbing heat generated by the charging circuit and dissipating the heat to the outside of the main body case, an insulation rib is disposed between the charging circuit and a sidewall where a rise in temperature caused by heat generated by the charging circuit is high, the insulation rib is provided with a space part from an upper sidewall portion having low thermal conductivity in order to restrict heat transfer to the upper side wall portion, and the main body case includes a case main body portion and a case bottom portion, the insulation rib directly contacting the case main body portion at two locations and extending toward the case bottom portion, and the space part being enclosed by the insulation rib and the upper sidewall portion.

* * * * *